(12) United States Patent
Sato et al.

(10) Patent No.: US 6,920,014 B2
(45) Date of Patent: Jul. 19, 2005

(54) MAGNETIC HEAD COMPRISING SLIDER AND FLEXURE BONDED WITH CONDUCTIVE RESIN

(75) Inventors: Hidezi Sato, Niigata-ken (JP); Sadao Kawata, Niigata-ken (JP)

(73) Assignee: Alps Electronic Co., Ltd., Tokyo (JP)

( * ) Notice: Subject to any disclaimer, the term of this patent is extended or adjusted under 35 U.S.C. 154(b) by 0 days.

(21) Appl. No.: 10/326,246

(22) Filed: Dec. 19, 2002

(65) Prior Publication Data

US 2003/0123189 A1 Jul. 3, 2003

(30) Foreign Application Priority Data

Dec. 28, 2001 (JP) .................................... 2001-398738

(51) Int. Cl.[7] .............................................. G11B 5/60
(52) U.S. Cl. ................................................ 360/234.5
(58) Field of Search ................................... 360/234.5

(56) References Cited

U.S. PATENT DOCUMENTS

| | | | |
|---|---|---|---|
| 5,732,459 A | 3/1998 | Shiraishi et al. | 29/603.06 |
| 5,901,014 A * | 5/1999 | Hiraoka et al. | 360/234.5 |
| 2001/0048573 A1 * | 12/2001 | Kawai et al. | 360/234.5 |
| 2003/0053256 A1 * | 3/2003 | Satoh et al. | 360/245.4 |

FOREIGN PATENT DOCUMENTS

| | | | | |
|---|---|---|---|---|
| JP | 49-28630 | | 3/1974 | |
| JP | 61-98781 | | 5/1986 | |
| JP | 62-79281 | | 4/1987 | |
| JP | 01118580 A | * | 5/1989 | ............ C09D/5/24 |
| JP | 01120039 A | * | 5/1989 | ........... H01L/21/92 |
| JP | 2-244419 | | 9/1990 | |
| JP | 11-232811 | | 8/1999 | |
| JP | 2000-215428 | | 8/2000 | |
| JP | 2001-172582 | | 6/2001 | |
| WO | WO 00/52710 | | 9/2000 | |

* cited by examiner

*Primary Examiner*—David D. Davis
(74) *Attorney, Agent, or Firm*—Brinks Hofer Gilson & Lione

(57) ABSTRACT

A magnetic head includes a slider having a recording and/or reproducing thin film element, and a flexure having an elastically deformable tongue piece, the slider and the flexure being bonded together and electrically connected with a conductive resin film. The conductive resin film includes at least one conductor containing carbon particles, carbon nano-tubes, or a metal nano-powder, a resin adhesive, and a metal conductive filler. The conduction-start voltage of the conductive resin film is set to 1.0 V or less.

7 Claims, 5 Drawing Sheets

MAGNETIC HEAD COMPRISING SLIDER AND FLEXURE BONDED WITH CONDUCTIVE RESIN

BACKGROUND OF THE INVENTION

1. Field of the Invention

The present invention relates to a flying magnetic head device mounted on a hard disk device or the like, and particularly to a technique suitably used for a magnetic head comprising a slider and a flexure for supporting the slider, both of which are bonded together with a conductive resin film.

2. Description of the Related Art

FIG. 7 is a partial side view showing the structure of a conventional magnetic head device used for a hard disk device. The magnetic head device comprises a slider 1, and a support member 2 for supporting the slider 1.

The slider 1 comprises a ceramic material, or the like. Also, a thin film element 4 is provided on the trailing-side end B of the slider 1. The thin film element 4 comprises a MR head (read head) for detecting a leakage magnetic field from a recording medium such as a hard disk by using magnetoresistance to read a magnetic signal, and an inductive head (write head) comprising a patterned coil.

The support member 2 comprises a load beam 5 and a flexure 6. The load beam 5 comprises a leaf spring material such as stainless steel, and is formed in a structure in which bent portions 5a having rigidity are formed on both sides of the tip portion. A predetermined elastic pressure can be exerted at the base end of the load beam 5 where the bent portions 5a are not formed.

Also, a spherical pivot 7 is formed near the tip end of the load beam 5 so as to project downward as shown in FIG. 7, so that the slider 1 is abutted against the pivot 7 through the flexure 6 described below. The flexure 6 comprises a thin leaf spring made of stainless steel, or the like. The flexure 6 comprises a fixed portion 6a and a tongue piece 6b both of which are connected by a step portion 6c.

As shown in FIG. 7, the slider 1 is bonded to the bottom of the tongue piece 6b with a resin adhesive 20. The resin adhesive 20 is, for example, a thermosetting epoxy resin. Also, a conductive pattern (not shown in the drawing) is formed in the back side of the tongue piece 6b, and an electrode terminal portion (not shown in the drawing) comprising a thin film led out of the thin film element 4 is provided on the trailing-side end B of the slider 1. Furthermore, a joint 9 is formed at the junction portion between the conductive pattern and the electrode terminal portion by gold (Au) ball bonding. The joint 9 is covered with a reinforcing resin film 10 for protection.

Also, a fillet-like conductive resin film 21 is formed between the leading-side end A of the slider 1 and the tongue piece 6b. The conductive resin film 21 is provided for securing conduction between the slider 1 and the flexure 6, and for dissipating static electricity from the slider 1 to the support member 2. The upper surface of the tongue piece 6b is abutted against the pivot 7 formed on the load beam 5 so that the slider 1 bonded to the bottom of the tongue piece 6b can be freely moved by means of elasticity of the tongue 6b, with the top of the pivot 7 serving as a fulcrum. For the conductive resin film 21, a rigid resin such as a thermosetting epoxy resin or the like is conventionally used as an adhesive (binder).

The slider 1 of the magnetic head device is urged to the disk D by elastic force at the base end of the lead beam 5. The magnetic head device is used for a so-called CSS (Contact Start Stop)-system hard disk device. When the disk D stops, an air bearing surface (ABS) (flying surface) 1a of the slider 1 comes into contact with a recording surface of the disk D due to the elastic force. When the disk D starts, an air flow is led to the space between the slider 1 and the surface of the disk D along the moving direction of the disk D so that the ABS 1a of the slider 1 is subjected to a flying force of the air flow to fly the slider 1 at a short distance $\delta 2$ (spacing) from the surface of the disk D.

In a flying state as shown in FIG. 7, the slider 1 is inclined so that the leading side end A is raised higher from the disk D than the trailing-side end B. In this flying state, magnetic signals from the disk D are detected by the RM head of the thin film element 4, or the magnetic signals are written by the inductive head.

The above-described magnetic head device is generally manufactured by a manufacturing process comprising bonding the upper surface of the slider 1 to the lower surface of the tongue piece 6b of the flexure 6, electrically connecting an electrode of the flexure 6 to a pad of the slider 1 through the joint 9 comprising a gold ball, and inspecting the electrical properties of the magnetic head device to select only a good product.

In this case, the electrical properties are inspected under substantially the same condition as in an operation, in which the ABS (flying surface) 1a of the slider 1 comes into contact with the recording surface of the disk D, and then the disk D starts so that the slider 1 flies at a short distance $\delta 2$ (spacing) from the surface of the disk D. Therefore, the slider 1 is electrically charged by friction with the disk D to possibly cause a potential difference between the slider 1 and the disk D.

In addition, for example, in a load/unload system head other than the CSS-system hard disk device, a medium is ideally out of contact with a slider, but in fact, the medium is occasionally in contact with the slider (contact during running). Therefore, like in the CSS system, the load/unload system possibly causes a potential difference between the slider and the medium.

In the above-described magnetic head, the conductive resin film 21 is generally thought to secure conduction due to the dielectric breakdown produced between the particles of the conductive filler blended with the resin. Therefore, the resin film 21 does not exhibit conductivity until a voltage over a predetermined threshold value is applied, and thus conduction between the slider 1 and the flexure 6 is not secured until the voltage exceeds the threshold value.

Therefore, when the threshold value is higher than the electrostatic damage limit value at which electrostatic damage (ESD) occurs to a MR element or the like, conduction between the slider 1 and the flexure 6 cannot be secured, and thus an electric charge cannot be dissipated from the conductive resin film 21 to the support member 2 when the slider 1 is electrically charged. There is thus a problem that the thin film element 4 comprising the RM head is possibly electrostatically damaged when the electrically charged slider 1 is in contact with a metal or the like. Particularly, the size (particularly, the thickness) of the MR element tends to decrease more and more, and the withstand voltage also tends to decrease more and more.

SUMMARY OF THE INVENTION

In consideration of the above situation, the present invention is aimed at achieving the following objects.

(1) To prevent the occurrence of electrostatic damage to a magnetic head device.

(2) To decrease a conduction-start voltage of a conductive resin film.

(3) To improve the conductive property of the conductive resin film.

In order to achieve the objects, a magnetic head of the present invention comprises a slider having a recording and/or reproducing thin film element, and a flexure having an elastically deformable tongue piece, both of which are bonded together and electrically connected by a conductive resin film.

The conductive resin film comprises at least one conductor comprising carbon particles, carbon nano-tubes, or a metal nano-powder, a resin adhesive, and a metal conductive filler.

The conduction-start voltage of the conductive resin film is set to 1.0 V or less.

In the present invention, the conduction-start voltage of the conductive resin is preferably set to 0.5 V or less.

In the magnetic head of the present invention, the conductive resin film for electrically connecting the slider to the flexure comprises at least one conductor comprising the carbon particles, the carbon nano-tubes, or the metal nano-powder, the resin adhesive, and the metal conductive filler, and the conduction-start voltage of the conductive resin film is set to 1.0 V or less, and preferably 0.5 V or less. Therefore, even when the slider is electrically charged, an electric charge can be rapidly dissipated to the flexure with the conduction-start voltage, and thus the occurrence of electrostatic damage to the recording and/or reproducing thin film element due to electric charging of the slider can be prevented.

In the present invention, the conduction-start voltage represents a predetermined threshold voltage of the voltage applied to the conductive resin film when dielectric breakdown occurs in spaces in the metal conductive filler, spaces in the conductor, and spaces between the metal conductive filler and the conductor, thereby securing conduction in the conductive resin film.

When a conductive resin film comprising a resin adhesive and a metal conductive filler is used, a portion comprising only the resin adhesive (a portion where the metal conductive filler is out of contact with the surface of the slider or the flexure) easily occurs near the surface of the slider or the flexure, and between the particles of the conductive filler (spaces between the conductive filler particles) because the particle diameter of the metal conductive filler is as large as several $\mu$m to several tens $\mu$m. Therefore, even if the slider is electrically charged, the conduction-start voltage cannot be decreased to lower than 2 to 3 V.

On the other hand, in the magnetic head of the present invention, the conductive resin film comprises at least one conductor comprising the carbon particles, the carbon nano-tubes, or the metal nano-powder, the resin adhesive, and the metal conductive filler, and the conductor has a smaller diameter than the above-described conductive filler. Therefore, the conductor enters into the spaces between the slider surface or the flexure surface and the metal conductive filler, and the spaces in the metal conductive filler, and thus the distance of the portion comprising only the resin adhesive is smaller than that in the case of the conductive resin film comprising the resin adhesive and the metal conductive filler. Furthermore, the conductor functions as a bridge between the slider surface or the flexure surface and the metal conductive filler and between the respective particles of the metal conductive filler, thereby improving conductivity. Therefore, even when the slider is electrically charged, an electric charge can be rapidly dissipated to the flexure with a conduction-start voltage of as low as 1.0 V or less, preferably 0.5 V or less, as described above.

Furthermore, the conductor has magnetism, or a network or needle-like (whisker-like) surface structure, and thus the conductor added to the conductive resin film easily links in a chain or agglomerates, thereby improving conductivity. Therefore, as described above, an electric charge can be rapidly dissipated to the flexure with the low conduction-start voltage.

When conduction between the slider and the flexure is secured by a material such as the above-described metal conductive filler, which has a large particle diameter, the amount of the filler added must be increased. However, by adding the conductor comprising carbon nano-tubes or the like, conduction can be secured even when the amount of the metal conductive filler added is decreased.

The conduction-start voltage of the conductive resin film can be changed by changing the content of the conductor in the conductive resin film.

Therefore, even if the spacing between the slider and the recording medium is further decreased by a technical development in future, and if the resistance of the thin film element of the slider against static electricity deteriorates, the above-descried conductive resin film is provided between the slider and the flexure in the present invention, thereby sufficiently avoiding the risk of the above-described electrostatic damage.

In the present invention, the flexure may comprise stainless steel, and the slider may comprise a ceramic material such as $Al_2O_3$—TiC, or the like.

In the magnetic head comprising the flexure made of stainless steel, and the slider made of a ceramic material such as $Al_2O_3$—TiC, or the like, when the conductive filler contained in the conductive resin film between the slider and the flexure is an Ag-based type, a portion (a portion where the Ag-based conductive filler is out of contact with the surface of the slider or the flexure) comprising only the resin adhesive easily occurs near the surface of the slider or the flexure. However, the conductive resin film contains the conductor as well as the Ag-based conductive filler, and thus the conductor enters into the space between the surface of the slider or the flexure and the Ag-based conductive filler. Therefore, the distance of the portion comprising only the resin adhesive is shorter than that in the case of the conductive resin film comprising the resin adhesive and the Ag-based conductive filler. Furthermore, the conductor functions as a bridge between the surface of the slider or the flexure and the Ag-based conductive filler, thereby improving conductivity. Therefore, even when the slider is electrically charged, an electric charge can be rapidly dissipated to the flexure with a conduction-start voltage of as low as 1.0 V or less, preferably 0.5 V or less, as described above.

In the present invention, the resin adhesive may comprise a thermosetting resin or a thermoplastic elastomer. As the thermosetting resin, a thermosetting epoxy resin, a thermosetting polyester resin, or the like can be used. As the thermoplastic elastomer, an elastomer composed of an acrylic-, polyurethane-, polyester-, or nylon-type thermoplastic resin as a main component can be used.

As the metal conductive filler, an Ag-based conductive filler containing Ag, a Cu-based conductive filler containing Cu, an Au-based conductive filler containing Au, or the like can be used. The particle diameter of such a metal conductive filler is about 0.5 $\mu$m to 10 $\mu$m, and preferably about 0.5 $\mu$m to 5 $\mu$m. With the metal conductive filler having a particle diameter of over 10 μm, the probability of contact between the respectively filler particles decreases to deteriorate conductivity, while with the metal conductive filler having a particle diameter of less than 0.5 μm, the viscosity abruptly decreases with a relatively low filling rate of the filler, to form paste having low coating workability.

In the present invention, as the conductor, carbon particles, carbon nano-tubes, or a metal nano-powder, which has a smaller particle diameter than the conductive filler, is used, and particularly, the carbon nano-tubes are preferably used. This is because the carbon nano-tubes have a network surface structure, and thus the carbon nano-tubes added to the conductive resin film easily cause linkage in a chain, thereby improving conductivity between the slider and the flexure. Therefore, as described above, even when the slider is electrically charged, an electric charge can be rapidly dissipated to the flexure with a low conduction-start voltage.

As the carbon particles, acetylene black, fullerene, graphite, or the like can be used. Particularly, graphite has excellent conductivity, and is thus preferably used because the conduction-start voltage of the conductive resin film can be decreased. The average particle diameter of the carbon particles is preferably about 100 nm (0.1 μm) or 100 nm or less. With the carbon particles having an average particle diameter of over 100 nm, the carbon particles cannot enter into the spaces (skin layer) between the slider or the flexure and the metal conductive filler, and thus the effect of improving conductivity cannot be expected.

The carbon nano-tubes are composed of carbon, and comprise cylindrical hollow fibers each having an outer diameter of several nm (several thousandths μm) and a length of 102 times or more the diameter.

The carbon nano-tubes can be obtained by vapor phase decomposition reaction of a carbon-containing gas, or arc discharge using a carbon rod, a carbon fiber, or the like.

The carbon nano-tubes preferably have an outer diameter of several nm to ten or so nm (several thousandths μm to ten thousandths or so μm).

Although each of the carbon nano-tubes has a structure in which a graphite layer is rolled into a tube, either a structure (single-layer nano-tube) comprising one layer or a structure (multi-layer nano-tube) comprising a plurality of layers laminated concentrically may be used.

The carbon nano-tubes may be formed in an armchair structure or a helical structure depending upon the method of rolling the graphite layer (the orientation of carbon atoms). However, the armchair structure is preferred because conductivity can be improved.

The metal nano-powder comprises spherical or plate-shaped particles having a particle diameter of about 200 nm or less (about 0.2 μm or less). For example, the metal nano-powder is formed by powdering a metal such as Ni, Cu, Pd, Co, Pt, Au, Ag, or the like, or an alloy such as permalloy into a particle diameter of several tens nm.

Since each of the particles of the metal nano-powder functions as a magnet, the particles of the metal nano-powder added to the conductive resin film link to each other in the form of a chain, thereby improving conductivity.

With the metal nano-power having a particle diameter of over 200 nm, the powder cannot enter into the spaces (skin layer) between the slider or the flexure and the metal conductive filler, and the effect of improving conductivity cannot be expected. The particle diameter of the metal nano-powder is preferably 100 nm or less (0.1 μm or less), and more preferably 50 nm or less (0.05 μm or less).

In the present invention, the content of the resin adhesive in a total of 100% by weight of the resin adhesive and the metal conductive filler (100% by weight of the conductive adhesive comprising the resin adhesive and the metal conductive filler.) is preferably 10% by weight to 20% by weight, and more preferably 10% by weight to 15% by weight.

Also, the content of the metal conductive filler in a total of 100% by weight of the resin adhesive and the metal conductive filler (100% by weight of the conductive adhesive comprising the resin adhesive and the metal conductive filler) is preferably 80% by weight to 90% by weight, and more preferably 85% by weight to 90% by weight.

In the present invention, the conductor is preferably added in an amount of 10% by weight to 20% by weight based on a total of 100% by weight of the resin adhesive and the metal conductive filler (100% by weight of the conductive adhesive comprising the resin adhesive and the metal conductive filler).

When the amount of the conductor added exceeds 20% by weight, the content of the resin adhesive in the conductive resin film is decreased to deteriorate adhesion (binder property), or to produce a fear of dusting due to falling of the conductor particles, thereby adversely affecting reliability.

When the amount of the conductor added is less than 10% by weight, conductivity between the flexure and the slider cannot be so much expected.

In the present invention, when a voltage of 1 V is applied between the slider and the flexure, the resistance value is preferably 10Ω or less.

In the magnetic head in which the resistance value is set to 10Ω or less with the measurement voltage of 1 V applied between the slider and the flexure, even when the slider is electrically charged due to friction between the slider and the medium to produce a potential difference of 1 V or more between the slider and the medium, an electric charge can be rapidly dissipated from the slider to the flexure through the conductive resin film because of the low resistance between the slider and the flexure. It is thus possible to prevent the occurrence of electrostatic damage to the recording and/or reproducing thin film element due to electrical charging of the slider.

In the present invention, when a voltage of 0.5 V is applied between the slider and the flexure, the resistance value is preferably 1 kΩ or less.

In the magnetic head in which the resistance value is set to 1 kΩ or less with the measurement voltage of 0.5 V applied between the slider and the flexure, even when the slider is electrically charged due to friction between the slider and the medium to produce a potential difference of 0.5 V or more between the slider and the medium, an electric charge can be rapidly dissipated from the slider to the flexure through the conductive resin film because of the low resistance between the slider and the flexure. It is thus possible to prevent the occurrence of electrostatic damage to the recording and/or reproducing thin film element due to electrical charging of the slider.

Therefore, the magnetic head of the present invention can be sufficiently applied to cases in which a thin film element such as a MR head is further miniaturized and improved in performance with increases in the magnetic recording density in future, and a threshold voltage at the time of occurrence of electrostatic damage to the thin film element is further decreased. It is thus possible to further prevent the occurrence of electrostatic damage to the thin film element.

DESCRIPTION OF THE PREFERRED EMBODIMENTS

A magnetic head according to an embodiment of the present invention will be described below with reference to the drawings.

Figure 1:
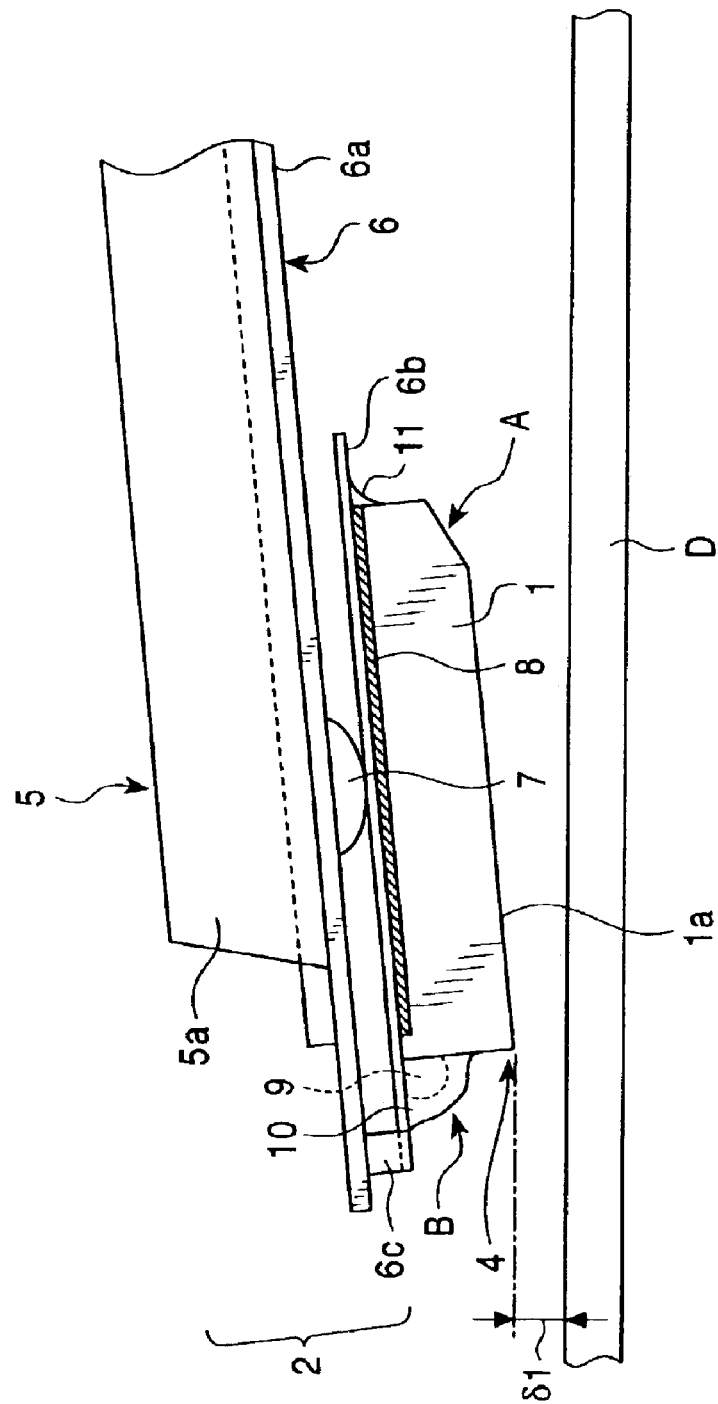
FIG. 1 is a partial side view showing a magnetic head device according to an embodiment of the present invention.
Figure 2:
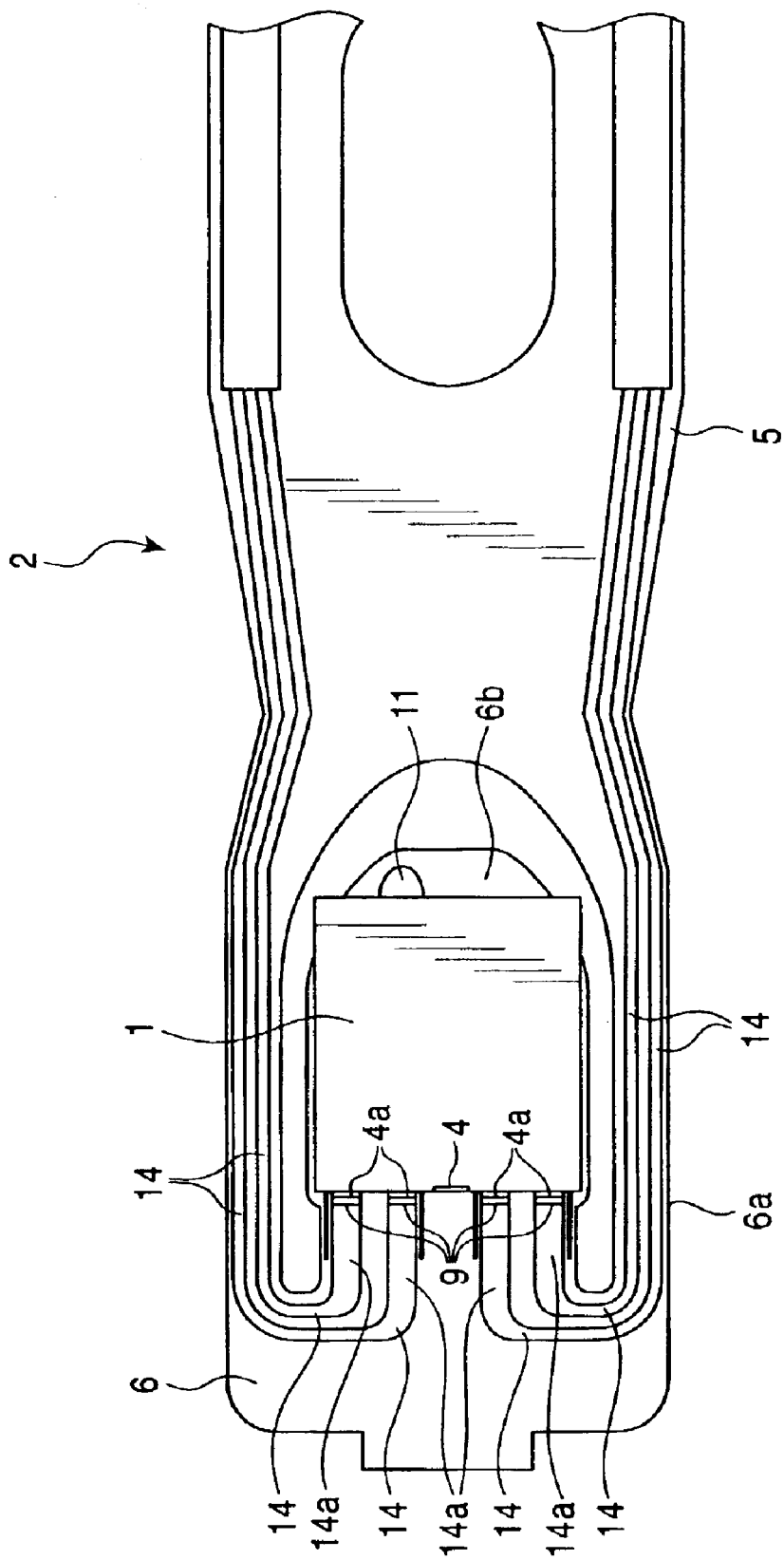
FIG. 2 is a partial plan view of the magnetic head device shown in FIG. 1, as viewed from the back of a tip region.

FIG. 1 is a partial side view showing a flying magnetic head device mounted on a hard disk device or the like according to an embodiment of the present invention, and FIG. 2 is a partial plan view of the magnetic head device shown in FIG. 1, as viewed from the back of a tip region.

The magnetic head device comprises a slider 1, and a support member 2 for supporting the slider 1.

As shown in FIG. 1, the slider 1 comprises a ceramic material composed of a nonmagnetic material such as $Al_2O_3$—TiC, or the like, and a thin film element 4 comprising a laminate of a reproducing head and a write head is provided on the trailing-side end B of the slider 1. Also, an air bearing surface (ABS) (flying surface) 1a is formed on the surface of the slider 1, which opposes a disk D. The thin film element 4 is formed by laminating a magnetic material such as permalloy (Ni—Fe alloy), and an insulating material such as alumina or the like, and comprises a magnetic detection portion (reproducing head) for reproducing a magnetic recorded signal recorded on the disk D, a magnetic recording portion (write head) for recording a magnetic signal in the disk D, or both the magnetic detection portion and the magnetic recording portion. The magnetic detection portion comprises a MR head including, for example, a magnetoresistive element (MR element). The magnetic recording portion comprises an inductive head including a pattern having a coil and a core.

The support member 2 comprises a load beam 5 and a flexure 6. The load beam 5 is made of a leaf spring material such as stainless steel (SUS304), or the like. The load beam 5 is formed in a structure in which bent portions 5a having rigidity are formed on both sides to extend from an upper right portion in FIG. 1 to the vicinity of the tip. The bent portions 5a are provided to extend to substantially an intermediate position of the load beam 5 so that a leaf spring function portion (not shown in the drawing) without the bent portions 5a is formed to extend from the rear end of each of the bend portions 5a to the base end.

The load beam 5 further comprises a spherical pivot 7 formed in the flat portion between the bent portions 5a to project downward as shown in FIG. 1. The top of the pivot 7 is abutted against the upper surface of the slider 1 through a tongue piece 6b of the flexure 6, which will be described below.

The flexure 6 comprises a thin leaf spring made of stainless steel (SUS304). Also, the flexure 6 comprises a fixed portion 6a and the tongue piece 6b both of which are connected through a step portion 6c. As shown in FIG. 1, the slider 1 is bonded to the lower surface of the tongue piece 6b with a resin adhesive 8. The resin adhesive 8 preferably has the same properties as a conductive resin film 11, which will be described below, except conductivity.

As shown in FIG. 2, a conductive pattern 14 is formed in a tip region so as to extend from the fixed portion 6a to the tongue piece 6b of the flexure 6. The width of the conductive pattern 14 formed on the tongue piece 6b gradually increases in the direction to the base end of the flexure 6 to form wide portions 14a for connection to the slider 1. Also, electrode terminals 4a led out of the thin film element 4 and each comprising a thin film are formed on the trailing-side end B of the slider 1 with same intervals as the connection portions 14a of the conductive pattern 14.

In this embodiment, the electrode terminals 4a provided on the trailing-side end B of the slider 1 are respectively rigidly bonded to the connection portions 14a provided on the flexure 6 with joints 9 by gold (Au) ball bonding. As shown in FIG. 1, each of the joints 9 is covered with a reinforcing resin film 10 for protection. In FIG. 2, the reinforcing resin film 10 is omitted.

As shown in FIGS. 1 and 2, the fillet-like conductive resin film 11 is formed between the leading-side end A of the slider 1 and the tongue piece 6b of the flexure 6. The conductive resin film 11 is provided for securing conduction between the slider 1 and the flexure 6.

The conductive resin film 11 comprises at least one conductor comprising carbon particles, carbon nano-tubes, or a metal nano-powder, a resin adhesive, and a metal conductive filler.

As the resin adhesive, a thermosetting resin or thermoplastic elastomer can be used.

As the thermosetting resin, a thermosetting epoxy resin, a thermosetting polyester resin, or the like can be used.

As the thermoplastic elastomer, an elastomer composed of an acrylic, polyurethane, polyester or nylon thermoplastic resin as a main component can be used.

As the conductive metal filler, an Ag-based conductive filler containing Ag, a Cu-based conductive filler containing Cu, an Au-based conductive filler containing Au, or the like can be used. For the above-described reason, the particle diameter of such a conductive metal filler is about 0.5 $\mu$m to 10 $\mu$m, and preferably 0.5 $\mu$m to 5 $\mu$m.

For the above-described reason, the carbon nano-tubes among the carbon particles having a particle diameter smaller than the metal conductive filler, the carbon nano-tubes, and the metal nano-powder are preferably used as the conductor.

As the carbon particles, acetylene black, fullerene, graphite, or the like can be used. Particularly, graphite has excellent conductivity, and is thus preferably used because the conduction-start voltage of the conductive resin film can be decreased. For the above-described reason, the average particle diameter of the carbon particles is preferably about 100 nm (0.1 $\mu$m) or 100 nm or less.

The carbon nano-tubes are composed of carbon, and comprise cylindrical hollow fibers each having an outer diameter of several nm (several thousandths $\mu$m) and a length of 102 times or more the diameter.

The carbon nano-tubes have an outer diameter of several nm to ten or so nm (several thousandths $\mu$m to ten thousandths or so $\mu$m).

Although each of the carbon nano-tubes has a structure in which a graphite layer is rolled into a tube, either a single-layer nano-tube structure or a multi-layer nano-tube structure may be used. Also, the carbon nano-tubes may be formed in an armchair structure or a helical structure depending upon the orientation of carbon atoms. However, the armchair structure is preferred because conductivity can be improved.

For the above-described reason, the metal nano-powder comprising spherical or plate-shaped particles having a particle diameter of about 200 nm or less (about 0.2 $\mu$m or less) is used. For example, the metal nano-powder is formed by powdering a metal such as Ni, Cu, Pd, Co, Pt, Au, Ag, or the like, or an alloy such as permalloy into a particle diameter of several tens nm.

The particle diameter of the metal nano-powder is preferably 100 nm or less (0.1 $\mu$m or less), and more preferably 50 nm or less (0.05 $\mu$m or less).

The content of the resin adhesive in 100% by weight of the conductive adhesive comprising the resin adhesive and the conductive metal filler is preferably 10% by weight to 20% by weight, and more preferably 10% by weight to 15% by weight.

Also, the content of the metal conductive filler in 100% by weight of the conductive adhesive comprising the resin adhesive and the metal conductive filler is preferably 80% by weight to 90% by weight, and more preferably 85% by weight to 90% by weight.

The conductor is preferably added in an amount of 10% by weight to 20% by weight based on 100% by weight of the conductive adhesive comprising the resin adhesive and the metal conductive filler.

When the amount of the conductor added exceeds 20% by weight, the content of the resin adhesive in the conductive resin film 11 is decreased to deteriorate adhesion (binder property), or to produce a fear of dusting due to falling of the conductor particles, thereby adversely affecting reliability.

When the amount of the conductor added is less than 10% by weight, conductivity between the flexure 6 and the slider 1 cannot be so much expected.

In the magnetic head of this embodiment, the conductive resin film 11 for electrically connecting the slider 1 and the flexure 6 comprises the at least one conductor comprising the carbon particles, the carbon nano-tubes, or the metal nano-powder, the resin adhesive, and the metal conductive filler, and the conduction-start voltage is set to 1.0 V, and preferably 0.5 V. Therefore, even when the slider 1 is electrically charged, an electric charge can be rapidly dissipated from the slider 1 to the flexure 6 with the conduction-start voltage. It is thus possible to prevent the occurrence of electrostatic damage to the recording and/or reproducing thin film element due to electrical charging of the slider 1.

Figure 3:
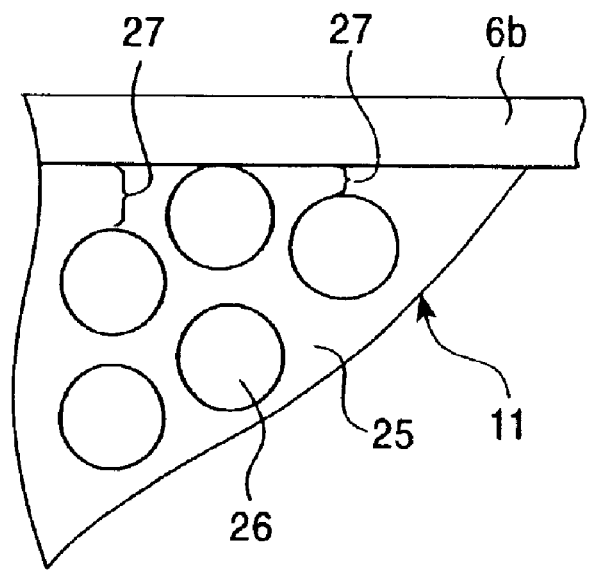
FIG. 3 is a schematic drawing showing a structure of a conductive resin film comprising a resin adhesive and a metal conductive filler.
Figure 4:
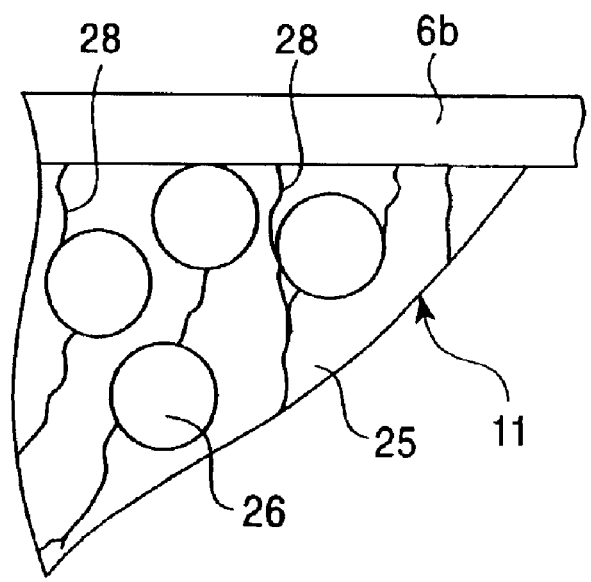
FIG. 4 is a schematic drawing showing a structure of a conductive resin film comprising a resin adhesive, a metal conductive filler, and a conductor according to the present invention.

FIG. 3 is a schematic drawing showing a structure of a conductive resin film comprising a resin adhesive and a conductive metal filler, and FIG. 4 a schematic drawing showing a structure of a conductive resin film comprising a resin adhesive, a conductive metal filler and a conductor according to the present invention.

As shown in FIG. 3, when a conductive resin film 11 comprising a resin adhesive 25 and a conductive metal filler 26 is used, a portion 27 (a portion where the conductive metal filler 26 is out of contact with the surface of the slider or flexure) comprising only the resin adhesive 25 occurs near the surface of the slider or flexure, and between the particles of the conductive metal filler 26 (in the spaces between the particles of the conductive metal filler 26) because the particle diameter of the conductive metal filler 26 is as large as several to several tens $\mu$m. Therefore, the conduction-start voltage cannot be decreased to lower than 2 to 3 V even when the slider is electrically charged.

On the other hand, in the magnetic head of this embodiment, as shown in FIG. 4, the conductive resin film 11 comprises at least one conductor 28 (in FIG. 4, the conductor 28 comprises carbon nano-tubes) comprising the carbon particles, the carbon nano-tubes, or the metal nano-powder, the resin adhesive 25, and the metal conductive filler 26, and the conductor 28 has a smaller diameter than the conductive filler 26. Therefore, the conductor 28 enters into the spaces between the surface of the slider 1 or the flexure 6 and the metal conductive filler 26, and between the particles of the metal conductive filler 26, and thus the distance of the portion comprising only the resin adhesive 25 is shorter than that in the case of the conductive resin film 11 comprising the resin adhesive 25 and the metal conductive filler 26. Furthermore, the conductor 28 functions as a bridge between the surface of the slider 1 or the flexure 6 and the metal conductive filler 26 and between the particles of the metal conductive filler 26, thereby improving conductivity. Therefore, even when the slider 1 is electrically charged, an electric charge can be rapidly dissipated to the flexure 6 with the conduction-start voltage of as low as 1.0 V or less, preferably 0.5 V or less, as described above.

In the magnetic head comprising the flexure 6 made of stainless steel, and the slider 1 made of a ceramic material such as $Al_2O_3$—TiC, or the like, when the conductive filler contained in the conductive resin film 11, which is provided between the slider 1 and the flexure 6, is an Ag-based type, a portion (a portion where the conductive metal filler is out of contact with the surface of the slider 1 or flexure 6) comprising only the resin adhesive 25 easily occurs near the surface of the slider 1 or the flexure 6. However, in this embodiment, as shown in FIG. 4, the conductive resin film 11 contains the conductor 28 as well as the Ag-based conductive filler 26, and thus the conductor 28 enters into the space between the Ag-based conductive filler 26 and the surface of the slider 1 or the surface of the tongue piece 6b of the flexure 6. Therefore, the distance of the portion comprising only the resin adhesive 25 is shorter than that in the case of the conductive resin film 11 comprising the resin adhesive 15 and the Ag-based conductive filler 26. Furthermore, the conductor 28 functions as a bridge between the surface of the slider 1 or the surface of the tongue piece 6b of the flexure 6 and the Ag-based conductive filler 26, thereby improving conductivity. Therefore, even when the slider 1 is electrically charged, an electric charge can be rapidly dissipated to the flexure 6 with a conduction-start voltage of as low as 1.0 V or less, preferably 0.5 V or less, as described above.

Furthermore, the conductor 28 has magnetism, or a network or needle-like (whisker-like) surface structure, and thus the conductor 28 added to the conductive resin film 11 easily links in a chain or agglomerates, thereby improving conductivity. Therefore, as described above, an electric charge can be rapidly dissipated to the flexure 6 with a low conduction-start voltage.

When conduction between the slider 1 and the flexure 6 is secured by a material such as the above-described metal conductive filler 26, which has a large particle diameter, the amount of the filler 26 added must be increased. However, by adding the conductor 28 comprising carbon nano-tubes or the like, conduction can be secured even when the amount of the metal conductive filler 26 added is decreased.

The conduction-start voltage will be described below.

Figure 5:
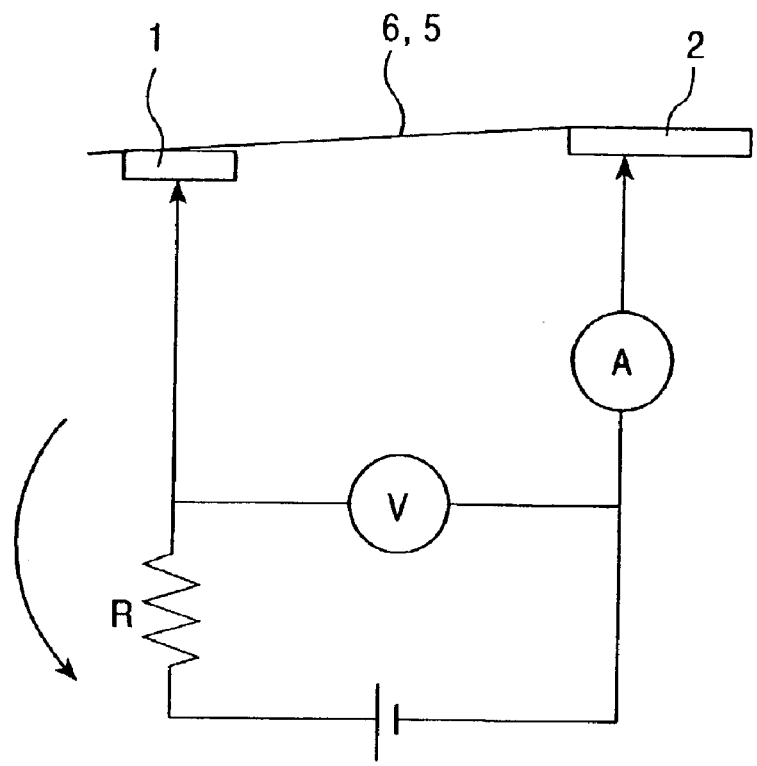
FIG. 5 is a schematic drawing illustrating measurement of a resistance value with a conduction-start voltage according to an embodiment of the present invention.

FIG. 5 is a schematic drawing illustrating measurement of a resistance value with the conduction-start voltage of this embodiment.

As shown in FIG. 5, conductivity between the slider 1 and the support member 2 in the magnetic head device is measured with the conduction-start voltage according to this embodiment.

In this measurement, a probe is brought into contact with the surface of the slider 1 comprising $Al_2O_3$—TiC, and another probe is brought into contact with the load beam 5 of the support member 2 or a mount plate connected to the load beam 5 in order to measure the resistance value between the slider 1 and the support member 2. When the surface of the slider 1 has a carbon coating, the probe is preferably brought into contact with the $Al_2O_3$—TiC surface after the coating is removed.

The resistance value is measured with increasing measurement voltages, and the voltage when the resistance value is lower than 1 kΩ (1 kΩ or less) is defined as the conduction-start voltage (threshold voltage).

The reason for setting the reference of the resistance value to 1 kΩ is that a resistance value permitting a conductor to function to dissipate an electric charge produced by friction is considered as about 1 kΩ, and thus the reference for start of conduction is set to 1 kΩ.

The above-described magnetic head of this embodiment is used for, for example, a CDD-system hard disk device (magnetic recording/reproducing device). When the disk D stops, the slider 1 is elastically pressed on the upper surface of the disk D due to elastic force of the leaf spring functional portion at the base end of the load beam 5, and the ABS 1a of the slider 1 comes into contact with the surface of the disk D. When the disk D starts to rotate, as shown in FIG. 1, the slider 1 entirely flies at a distance δ1 from the surface of the disk D due to an air flow led to the space between the slider 1 and the disk D, and assumes a flying state in which the leading-side end A is raised higher from the disk D than the trailing-side end B, or a flying state in which only the leading-side end A is raised from the surface of the disk D, while the trailing-side end B slides on the surface of the disk D while being in continuous or discontinuous contact with the surface of the disk D.

In the process for manufacturing the magnetic head, electrical properties are inspected by using a test disk D for confirming an operation. This inspection step is performed in substantially the same condition as in an operation, in which the ABS (flying surface) 1a of the slider 1 is brought into contact with the recording surface of the disk D, and the disk D starts so that the slider 1 flies at a short distance δ1 (spacing) from the surface of the disk D.

When the trailing-side end B of the slider 1 is rigidly bonded to the tongue piece 6b of the flexure 6 with the joints 9 by Au ball bonding, a material which is rich in flexibility, which has the function to absorb (buffer) distortion due to a difference between the thermal expansion coefficients of the slider 1 and the flexure 6, and which can decrease internal stress due to curing shrinkage must be used for the junction portion between the slider 1 and the tongue piece 6. Therefore, the above-described thermoplastic elastomer is preferably used as the resin adhesive in the conductive resin film 11.

As described above, in this embodiment, when the conductive resin film 11 comprising the thermoplastic elastomer used as the resin adhesive is used for the conductive junction portion between the slider 1 and the tongue piece 6b of the flexure 6, flexibility can be imparted to the conductive resin film 11, and the distortion ($\epsilon$) produced due to the difference between the thermal expansion coefficients of the slider 1 and the tongue piece 6b of the flexure 6 can be partially absorbed (buffered) to decrease thermal stress ($\delta$) exerted on the slider 1. It is thus possible to prevent the occurrence of a change in flatness or crown height of the ABS (flying surface) 1a of the slider 1, and to decrease a change in flatness, i.e., an amount of bonding deformation, of the ABS (flying surface) 1a during the formation of the conductive resin film 11 between the slider 1 and the flexure 6.

EXAMPLES

Examples of the present invention will be described below.

Example 1

In Example 1, for a magnetic head having the structure of the above-described embodiment, a silver-based conductive filler having a particle diameter of about 1 to 5 μm, and carbon nano-tubes having an outer diameter of about 5 nm were kneaded with an epoxy thermosetting resin for a conductive resin film. The carbon nano-tubes were added in an amount of 15% by weight based on 100% by weight of the conductive adhesive comprising the epoxy thermosetting resin and the silver-based conductive filler (16% by weight of the epoxy thermosetting resin and 84% by weight of the silver-based conductive filler).

Comparative Example 1

In Comparative Example 1, for a magnetic head having the same structure as Example 1, a silver-based conductive filler having a particle diameter of about 1 to 5 μm was kneaded with an epoxy thermosetting resin for a conductive resin film. The conductive resin film contained 16% by weight of the epoxy thermosetting resin, and 84% by weight of the silver-based conductive filler.

In each of Example 1 and Comparative Example 1, the resistance value between the slider 1 and the support member 2 was measured as shown in FIG. 5.

In the slider 1, the probe was brought into contact with the surface of the slider 1 comprising $Al_2O_3$—TiC, and in the support member 2, the other probe was brought into contact with the load beam 5 of the support member 2 or the mount plate connected to the load beam 5 in order to measure the resistance value between the slider 1 and the support member 2 while changing the applied voltage (measurement voltage) from 0 V to 100 V. The results are shown in FIG. 6.

Figure 6:
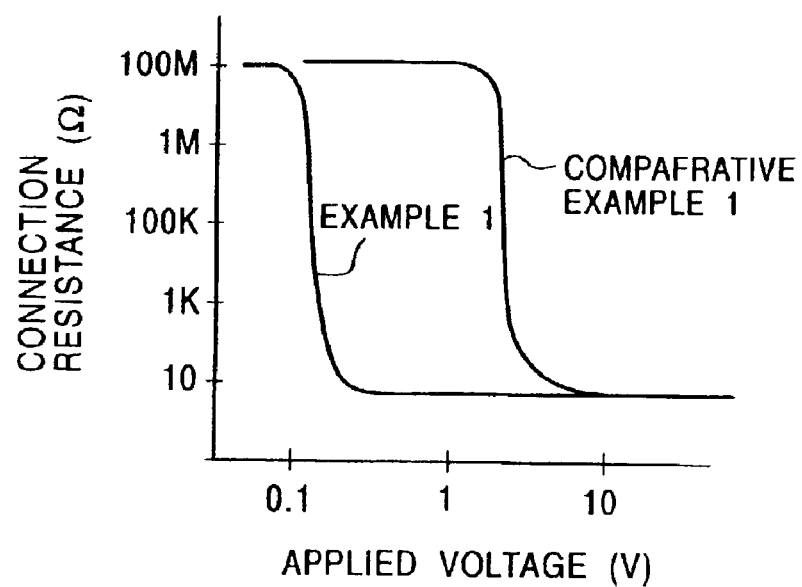
FIG. 6 is a graph showing a relationship between the measured voltage and resistance value of a magnetic head in each of Example 1 and Comparative Example 1.
Figure 7:
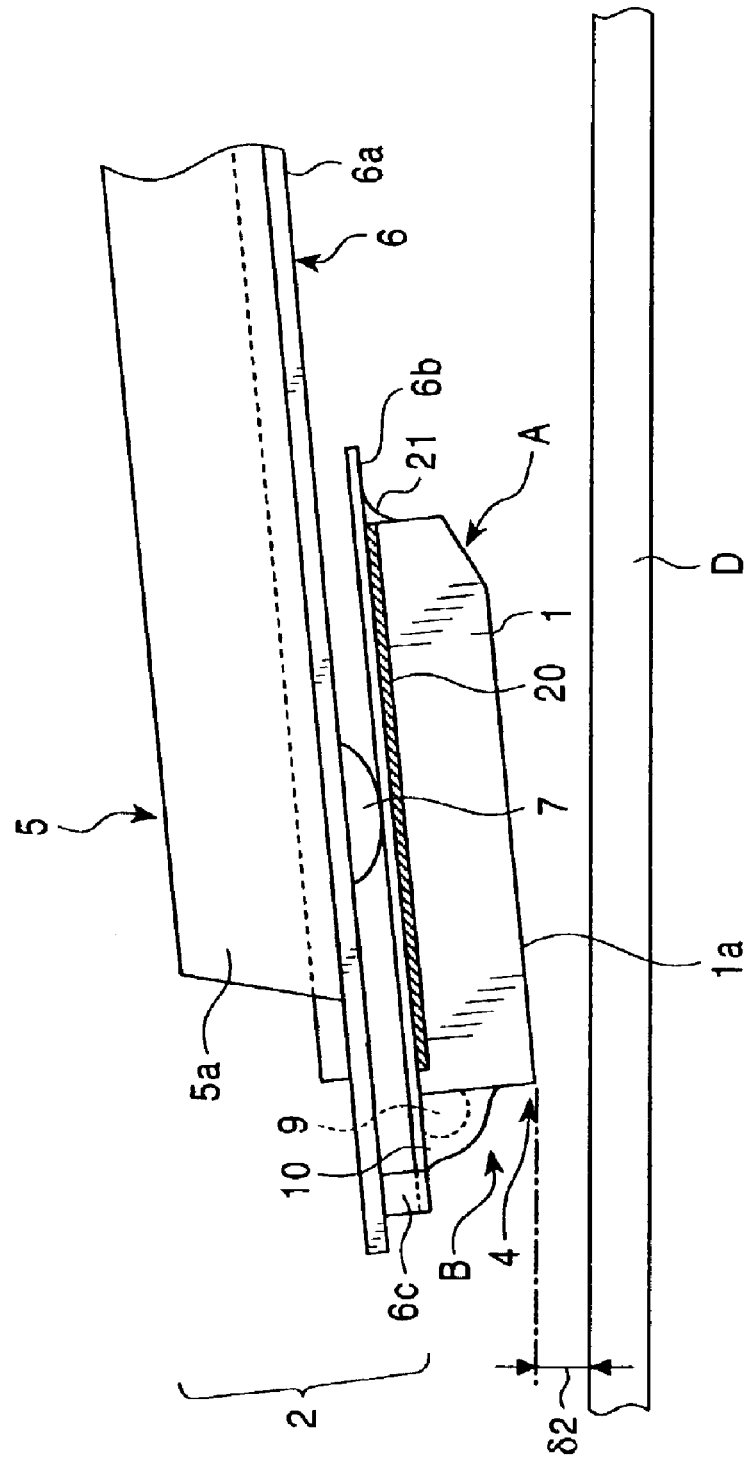
FIG. 7 is a side view showing a conventional magnetic head device.

The results shown in FIG. 6 indicate that in Example 1, the connection resistance value is about 10Ω with the measurement voltage of 1.0 V, while in Comparative Example 1, the connection resistance value is about 100Ω with the measurement voltage of 1.0 V. Also, in Example 1, the connection resistance value is about 1 kΩ with the measurement voltage of 0.5 V, while in Comparative Example 1, the connection resistance value is about 100 MΩ with the measurement voltage of 0.5 V.

Therefore, in the magnetic head of Example 1, the conduction-start voltage of the conductive resin film can be set to lower than that in Comparative Example 1.

As described above, in a magnetic head of the present invention, a conductive resin film for electrically connecting a slider and a flexure comprises at least one conductor comprising carbon particles, carbon nano-tubes, or a metal nano-powder, a resin adhesive, and a metal conductive filler. With the conduction-start voltage set to 1.0 V or less, preferably 0.5 V or less, even when the slider is electrically charged, an electric charge can be rapidly dissipated to the flexure with the conduction-start voltage, and thus electrostatic damage to a recording and/or reproducing thin film element due to electric charging of the slider can be prevented.

What is claimed is:

1. A thin film head comprising a slider comprising one of a recording and reproducing thin film element, and a flexure comprising an elastically deformable tongue piece, the slider and the flexure being electrically bonded together with a conductive resin film;

wherein the conductive resin film comprises a resin adhesive, a metal conductive filler, and at least one conductor comprising one of carbon particles, carbon nano-tubes, and a metal nano-powder; and a conduction-start voltage of the conductive resin film is set to at most 1.0 V.

2. A magnetic head according to claim 1, wherein the conduction-start voltage of the conductive resin film is set to at most 0.5 V.

3. A magnetic head according to claim 1, wherein the resin adhesive comprises one of a thermosetting resin and a thermoplastic elastomer.

4. A magnetic head according to claim 1, wherein the conductor comprises the carbon nano-tubes.

5. A magnetic head according to claim 1, wherein the conductor is added in an amount of 10% by weight to 20% by weight based on 100% by weight of a total of the resin adhesive and the metal conductive filler.

6. A magnetic head according to claim 1, wherein the resistance value is at most 1 k$\Omega$ when a voltage of 1 V is applied between the slider and the flexure.

7. A magnetic head according to claim 1, wherein the resistance value is at most 1 k$\Omega$ when a voltage of 0.5 V is applied between the slider and the flexure.

* * * * *